United States Patent [19]

Koike et al.

[11] Patent Number: 5,688,380
[45] Date of Patent: Nov. 18, 1997

[54] METHOD OF PRODUCING GIANT MAGNETORESISTIVE MATERIAL FILM AND MAGNETIC HEAD

[75] Inventors: Fumihito Koike; Naoya Hasegawa, both of Niigata-ken, Japan

[73] Assignee: Alps Electric Co., Ltd., Tokyo, Japan

[21] Appl. No.: 730,285

[22] Filed: Oct. 15, 1996

Related U.S. Application Data

[62] Division of Ser. No. 626,103, Apr. 3, 1996.

[30] Foreign Application Priority Data

Apr. 3, 1995 [JP] Japan .................................. 7-078022

[51] Int. Cl.⁶ .................................................. C23C 14/34
[52] U.S. Cl. ......................... 204/192.2; 204/192.15; 427/127; 427/131
[58] Field of Search ....................... 204/192.12, 192.15, 204/192.2; 427/127, 131

[56] References Cited

U.S. PATENT DOCUMENTS

| | | | |
|---|---|---|---|
| 3,908,194 | 9/1975 | Romankiw | 360/113 |
| 4,103,315 | 7/1978 | Hempstead et al. | 360/110 |
| 5,159,513 | 10/1992 | Dieny et al. | 360/113 |
| 5,373,238 | 12/1994 | McGuire et al. | 324/252 |
| 5,408,377 | 4/1995 | Gurney et al. | 360/113 |
| 5,422,571 | 6/1995 | Gurney et al. | 324/252 |
| 5,465,185 | 11/1995 | Heim et al. | 360/113 |
| 5,528,440 | 6/1996 | Fontana et al. | 360/113 |
| 5,546,253 | 8/1996 | Che | 360/113 |

*Primary Examiner*—Nam Nguyen
*Attorney, Agent, or Firm*—Guy W. Shoup; Patrick T. Bever

[57] ABSTRACT

A giant magnetoresistive material film includes at least two ferromagnetic layers of a NiFe alloy or NiFeCo alloy, which are formed on a substrate through a nonmagnetic layer of Au, Ag, Cu or Cr, wherein magnetization of at lest one of the ferromagnetic layers is pinned by a coercive force increasing layer of $\alpha\text{-Fe}_2\text{O}_3$ provided adjacent thereto and having a thickness of 200 to 1000 Å so as to increase coercive force of the ferromagnetic layer, and the other ferromagnetic layer has free magnetization so as to produce a change in resistance at a low magnetic field. The present invention also provides a method of producing the giant magnetoresistive material film and a magnetic head provided with the giant magnetoresistive material film.

2 Claims, 15 Drawing Sheets

MAGNETIC MEDIUM

METHOD OF PRODUCING GIANT MAGNETORESISTIVE MATERIAL FILM AND MAGNETIC HEAD

This application is a division U.S. Ser. No. 08/626,103, filed Apr. 3, 1996, pending.

BACKGROUND OF THE INVENTION

1. Field of the Invention

The present invention relates to magnetoresistive material films for a giant magnetoresistive device employed in magnetic heads, position sensors, rotation sensors and the like.

2. Description of the Related Art

An NiFe alloy (Permalloy) is a known magnetoresistive (MR) material which has been used for forming thin films for MR devices. Generally, the percentage change in resistance of a Permalloy thin film is within the range of 2 to 3%. Accordingly, magnetoresistive materials having magnetoresistive ratios (MR ratios) greater than that of Permalloy have been desired to cope with increases in linear density and track density in magnetic recording or increases in the resolving power of magnetic sensors.

Recently, a phenomenon called giant magnetoresistive effect has been found in a multilayer thin-film structure, such as a multilayer thin-film structure consisting of alternate layers of Fe thin films and Cr thin films or alternate layers of Co thin films and Cu thin films. In such a multilayer thin-film structure, the magnetizations of the ferromagnetic layers of Fe or Co interact magnetically through the nonmagnetic layers of Cr or Cu and the magnetizations of the stacked ferromagnetic layers are coupled to maintain an antiparallel alignment; that is, in this multilayer thin-film structure, the directions of magnetization of the ferromagnetic layers spaced alternately with the nonmagnetic layers are opposite to each other without an external magnetic field. When an appropriate external magnetic field is applied to such a structure, the magnetization directions of the ferromagnetic layers are aligned in a common direction.

In this multilayer thin-film structure, it is known that the state where the magnetizations of the ferromagnetic layers in an antiparallel alignment and the state where the magnetizations of the ferromagnetic layers are in a parallel alignment differ from each other in the scattering mode of conduction electrons in the interface between the ferromagnetic Fe layers and the nonmagnetic Cr layers or between the ferromagnetic Co layers and the nonmagnetic CU layers, depending upon the spins of the conduction electrons. Consequently, the electric resistance is high when the magnetization directions of the ferromagnetic layers are in an antiparallel alignment, the electric resistance is low when the magnetization directions of the ferromagnetic layers are in a parallel alignment, which produces the so-called giant magnetoresistive effect causing a resistance change at a high percentage ratio greater than that of resistance change in a Permalloy thin film. Thus, these multilayer thin-film structures have an MR producing mechanism basically different from that of the conventional single NiFe film.

However, since the magnetic interaction between the ferromagnetic layers of those multilayer thin-film structures that acts in an effort to set the magnetizations of the ferromagnetic layers in an antiparallel alignment is excessively strong, a very intense external magnetic field must be applied to those multilayer thin-film structures to set the magnetization directions of the ferromagnetic layers in a parallel alignment. Therefore, a large resistance change cannot be expected unless a very intense magnetic field is applied to the multilayer thin-film structures, and hence magnetic heads that detect an applied magnetic field of a very low intensity created by a magnetic recording medium are unable to function with satisfactorily high sensitivity when such a multilayer thin-film structure is incorporated into those magnetic heads.

It may be effective, for solving such problems, to adjust the thickness of the nonmagnetic layers of Cr or Cu so that the magnetic interaction between the ferromagnetic layers are not excessively strong and to control the relative magnetization directions of the ferromagnetic layers by another means other than the magnetic interaction.

A technique proposed to control the relative magnetization directions of the ferromagnetic layers employs an antiferromagnetic layer, such as an FeMn layer, to fix the magnetization direction of one of the ferromagnetic layers so that the magnetization direction of the same ferromagnetic layer may not be changed by an external magnetic field, and to allow the magnetization direction of the other ferromagnetic layer to change to enable the multilayer thin-film structure to be operated by an applied magnetic field of a very low intensity.

FIG. 22 shows a magnetoresistive sensor disclosed in U.S. Pat. No. 5,159,513 employing the foregoing technique. The magnetoresistive sensor A shown in FIG. 22 is formed by depositing a first magnetic layer 2, a nonmagnetic spacer 3, a second magnetic layer 4 and an antiferromagnetic layer 5 on a nonmagnetic substrate 1. The magnetization direction B of the second magnetic layer 4 is fixed by the magnetic exchange coupling effect of the antiferromagnetic layer 5, and the magnetization direction C of the first magnetic layer 2 is kept perpendicular to the magnetization direction B of the second magnetic layer 4 in the absence of an applied magnetic field. However, since the magnetization direction C of the first magnetic layer 2 is not fixed, the magnetization direction C can be rotated by an applied external magnetic field.

When a magnetic field h is applied to the MR sensor shown in FIG. 22, the magnetization direction C of the first magnetic layer 2 rotates as indicated by the arrows according to the direction of the applied magnetic field h and, consequently, the first magnetic layer 2 and the second magnetic layer 4 become different from each other in magnetization rotation causing a resistance change that enables the detection of the applied magnetic field.

FIG. 23 shows another example of magnetoresistive sensors having the structure in which one magnetic layer has a fixed magnetization direction, the other magnetic layer having a free magnetization direction. As shown in FIG. 23, the MR sensor B is formed by sequentially depositing an antiferromagnetic layer 7 of NiO, a magnetic layer 8 of Ni-Fe, a nonmagnetic metallic layer 9 of Cu, a magnetic layer 10 of Ni-Fe, a nonmagnetic metallic layer 11 of Cu, a magnetic layer 12 of Ni-Fe, and an antiferromagnetic layer 13 of FeMn in that order on a substrate 6.

In this structure, the antiferromagnetic layers 7 and 13 fix the magnetization directions of the adjacent ferromagnetic layers 8 and 12, and the magnetization direction of the ferromagnetic layer 10 sandwiched between the nonmagnetic layers 9 and 11 and disposed between the ferromagnetic layers 8 and 12 rotates according to the direction of an applied external magnetic field.

In the magnetoresistive sensor having the structure shown in FIG. 22 or 23, the resistance of the magnetoresistive sensor A or B varies linearly with high sensitivity with a small variation of the applied magnetic field. When the first magnetic layer 2 is formed of a soft magnetic material, such as Ni-Fe alloy, the MR sensor has the advantages in that the soft magnetic characteristics thereof can be used, and hysteresis is low.

The magnetoresistive sensor shown in FIG. 22 has the structure in which the antiferromagnetic layer 5 fixes the magnetization of the adjacent second magnetic layer 4, the second magnetic layer 2 having free magnetization. The magnetoresistive sensor shown in FIG. 23 has the structure in which the upper and lower antiferromagnetic layers 7 an 13 of FeMn and NiO, respectively, fix the magnetizations of the ferromagnetic metallic layers 8 and 12 disposed therebetween, the magnetic layer 10 having free magnetization. These magnetoresistive sensors thus have the limitation of the number of the interfaces between NiFe (magnetic layer) and Cu (nonmagnetic metallic layer) and the problem of limiting the MR ratio.

The FeMn alloy used as the material for forming the antiferromagnetic layers 5 and 7 has unfavorable problems with respect to corrosion resistance and environmental resistance.

FIG. 24 shows an example of modification of the magnetoresistive sensors having the structures shown in FIGS. 22 and 23. As shown in FIG. 24, a known magnetoresistive sensor C has a structure in which a nonmagnetic layer 16 of Cu, a hard magnetic material layer 17 comprising Co, Co-Pt or Co-Cr-Ta, a nonmagnetic layer 18 of Cu, and a soft magnetic material layer 19 of Ni-Fe are deposited repeatedly on a glass substrate 15.

In the magnetoresistive sensor C having the structure shown in FIG. 24, the thickness of the nonmagnetic layer 18 is adjusted to a predetermined value by employing the difference in coercive force between the hard magnetic material layer 17 and the soft magnetic material layer 19 so that the magnetization directions of both magnetic layers 17 and 19 can be made parallel or antiparallel, thereby obtaining the giant magnetoresistive effect. In the magnetoresistive sensor C having the structure shown in FIG. 24, the number of the layers deposited can be freely changed. The MR sensor C thus has the characteristic that the MR ratio greater than those of the magnetoresistive sensors having the structures shown in FIG. 22 and 23 can be obtained by increasing the number of the layers deposited.

However, in the magnetoresistive sensor C having the structure shown in FIG. 24, when the hard magnetic material layer 17 has large coercive force, the MR ratio can be increased, but the leakage flux is increased. This increases the coercive force of the soft magnetic material layer 19, and consequently causes the problem of deteriorating the sensitivity (the rate of change in resistance per unit magnetic field) of the MR sensor.

As a result of repeated research for solving the above problem, the inventors reached the conclusion that the high coercive force of the hard magnetic material layer 17 affects the soft magnetic material layer 19 because the anisotropic dispersion of the soft magnetic material layer 19 is increased due to the leakage magnetic field from the soft magnetic material layer 19. The inventors also reached the conclusion that the high coercive force affects the soft magnetic material layer 19 because the reversal of magnetization of the soft magnetic material layer 19 is inhibited by the hard magnetic material layer 17 due to the magnetostatic coupling between the hard magnetic material layer 17 and the soft magnetic material layer 19.

Therefore, such a magnetoresistive sensor C has the problem of making it difficult to adjust the effect of the coercive force of the hard magnetic material layer 17 on the soft magnetic material layer 19, and control the remanence ratio.

SUMMARY OF THE INVENTION

The present invention has been achieved in consideration of the above-mentioned situation, and an object of the present invention is to provide a giant magnetoresistive material film, a method of producing the same and a magnetic head using the same which can be formed without using a material such as FeMn having the problems with respect to corrosion resistance and environmental resistance, so as to have excellent corrosion resistance and heat resistance, cause no current shunt loss and the giant magnetoresistive effect by employing a difference in coercive force between magnetic layers, which permits the use of similar materials for forming magnetic films having a difference in coercive force and a decrease in coercive force of a film showing the rotation of magnetization, and which can obtain a large change in resistance with a small magnetic field.

In order to achieve the object, in accordance with an aspect of the present invention, there is provided a giant magnetoresistive material film comprising at least two ferromagnetic layers which are formed on a substrate through a nonmagnetic layer, wherein the direction of magnetization of at least one of the ferromagnetic layers is fixed by a coercive force increasing layer provided adjacent to the ferromagnetic layer to increase coercive force, the other ferromagnetic layer having free magnetization so that a change in resistance occurs at a low magnetic field.

In the above structure, the coercive force increasing layer may comprise an antiferromagnetic material, an antiferromagnetic oxide or $\alpha$-$Fe_2O_3$.

It is preferable that the coercive force of the ferromagnetic layer adjacent to the coercive force-increasing layer is set to 50 to 2000 Oe, the coercive force of the ferromagnetic layer not adjacent to the coercive force-increasing layer being set to 0 to 40 Oe. It is more preferable that the coercive force of the ferromagnetic layer adjacent to the coercive force-increasing layer is set to 100 to 1000 Oe, the coercive force of the ferromagnetic layer not adjacent to the coercive force-increasing layer being set to 0 to 20 Oe.

In the above-described structure, the coercive force-increasing layer comprising $\alpha$-$Fe_2O_3$ is preferably formed by sputtering under Ar gas pressure of 3 mTorr or less.

The thickness of the coercive force-increasing layer comprising $\alpha$-$Fe_2O_3$ is preferably set to 200 to 1000 Å.

Each of the ferromagnetic layers preferably comprises an Ni-Fe alloy, Co or an Ni-Fe-Co alloy. It is also preferable that the ferromagnetic layer adjacent to the coercive force-increasing layer comprises Co, and the ferromagnetic layer not adjacent to the coercive force-increasing layer comprises an Ni-Fe alloy layer or a two-layer structure comprising a Co layer adjacent to the nonmagnetic layer, and an Ni-Fe alloy layer.

The ferromagnetic layer adjacent coercive force-increasing layer preferably has a thickness of 150 Å or less.

On the other hand, the nonmagnetic layer preferably comprises at least one selected from Au, Ag, Cu and Cr. The nonmagnetic layer preferably has a thickness of 10 to 50 Å, and more preferably a thickness of 20 to 30 Å.

In accordance with another aspect of the present invention, there is provided a method of producing a giant magnetoresistive material film comprising the steps of forcing a coercive force-increasing layer comprising $\alpha$-$F_2O_3$ on a substrate by sputtering with applying a magnetic field in an atmosphere under Ar gas pressure of 3 mTorr or less, and forming at least two ferromagnetic layers on the coercive force-increasing layer with a nonmagnetic layer therebetween.

In accordance with still another aspect of the present invention, there is provided a method of producing a giant magnetoresistive material film comprising the steps of forming a coercive force-increasing layer comprising $\alpha$-$Fe_2O_3$ on a substrate by sputtering without applying a magnetic field in an atmosphere under Ar gas pressure of 3 mTorr or less, and forming at least two ferromagnetic layers on the coercive force-increasing layer with a nonmagnetic layer therebetween.

In accordance with a further aspect of the present invention, there is provided a magnetic head comprising lower and upper core layer opposite to each other with a magnetic gap therebetween, a coil layer for applying a magnetic field to the core layers, a giant magnetoresistive device provided adjacent to the magnetic gap outside of the core layers, wherein the giant magnetoresistive device comprises the above-described magnetoresistive material film.

DESCRIPTION OF THE PREFERRED EMBODIMENTS

Figure 1:
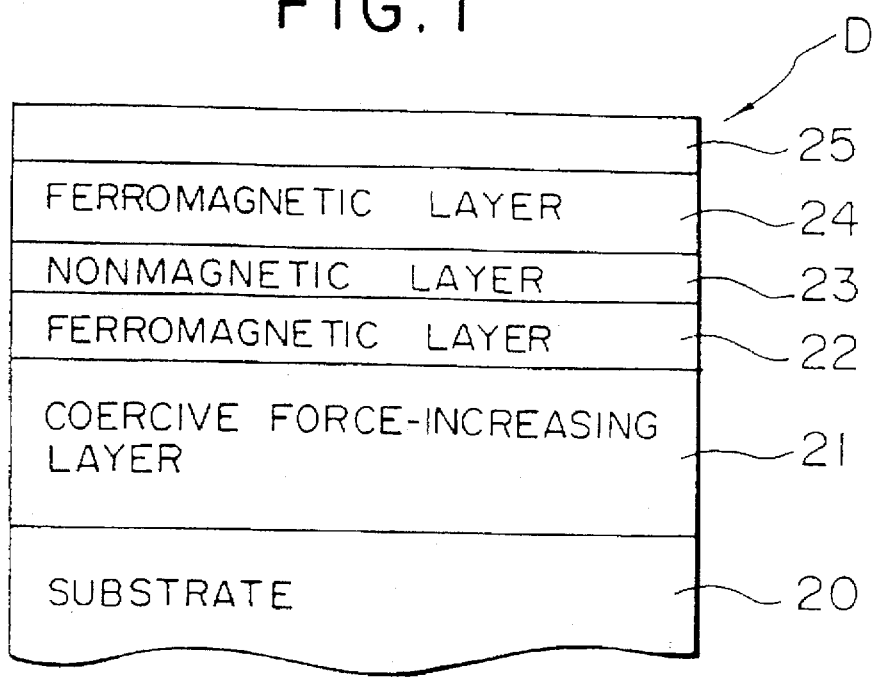
FIG. 1 is a sectional view showing a giant magnetoresistive material film in accordance with a first embodiment of the present invention.

A giant magnetoresistive material of the present invention comprises ferromagnetic layers provided with a nonmagnetic layer therebetween, one of the ferromagnetic layers being subjected to exchange coupling to a coercive force increasing layer so that magnetization thereof is fixed, the other ferromagnetic layer having free magnetization. Therefore, the magnetization direction of the ferromagnetic layer having free magnetization is changed by an external magnetic field, thereby exhibiting the giant magnetoresistive effect. Since the ferromagnetic layers are not limited to a two-layer structure, and can be formed in a multilayer structure, a layered film exhibiting the giant magnetoresistive effect can be provided. The coercive force increasing layer for producing exchange coupling as a source for producing giant magnetoresistance can be formed by using a ferromagnetic material or an antiferromagnetic oxide, specifically, $\alpha$-$Fe_2O_3$.

When the coercive force of the ferromagnetic layer adjacent to the coercive force increasing layer and the coercive force of the other ferromagnetic layer are set within the ranges of 50 to 2000 Oe and 0 to 40 Oe, respectively, good characteristics can be attained. When the coercive force of the ferromagnetic layer adjacent to the coercive force increasing layer and the coercive force of the other ferromagnetic layer are set within the ranges of 100 to 1000 Oe and 0 to 20 Oe, respectively, more excellent characteristics can be obtained.

If the coercive force increasing layer of $\alpha$-$Fe_2O_3$ is formed by sputtering in an atmosphere under Ar gas pressure of 3 mTorr or less, the large magnetoresistive effect can be exhibited. Although a blocking magnetic field at which magnetization of the ferromagnetic layer subjected to exchange coupling to the coercive force increasing layer is reversed is preferably large, the coercive force of the ferromagnetic layer, which is subjected to exchange coupling to the coercive force increasing layer, is preferably increased for increasing the blocking magnetic field. When the ferromagnetic layer is formed by sputtering under Ar gas pressure of 3 mTorr or less, as described above, the coercive force of the ferromagnetic layer is increased, thereby obtaining a good giant magnetoresistive material film.

When the coercive force increasing layer of $\alpha$-$Fe_2O_3$ has a thickness within the range of 200 to 1000Å, the large magnetoresistive effect can stably be obtained.

The ferromagnetic layer may comprise an Ni-Fe alloy, Co or an Ni-Fe-Co alloy. Particularly, when the ferromagnetic layer adjacent to the coercive force increasing layer comprises Co, and the other ferromagnetic layer has either a two-layer structure comprising a Co layer and an Ni-Fe alloy layer, or a single layer film comprising Ni-Fe, the more satisfactory magnetoresistive effect can be obtained.

The ferromagnetic layer adjacent to the coercive force increasing layer preferably has a thickness of not more than 150Å because the coercive force is readily increased, and the large magnetoresistive effect can easily be obtained. It is preferably for obtaining a large change in magnetoresistance that the nonmagnetic layer preferably has a thickness within the range of 10 to 50Å. With the nonmagnetic layer having a thickness within the range of 20 to 30Å, it is possible to decrease the effect of the ferromagnetic layer on the other ferromagnetic layer having free magnetization.

When the giant magnetoresistive material film is produced, the coercive force increasing layer comprising $\alpha\text{-Fe}_2\text{O}_3$ is formed on the substrate by sputtering in an atmosphere under Ar gas pressure of 3 mTorr or less with application of a magnetic field or without application of a magnetic field, and at least two ferromagnetic layers are formed on the coercive force increasing layer with the nonmagnetic layer therebetween. In this case, the giant magnetoresistive material film exhibiting the excellent magnetoresistive effect can be obtained.

Particularly, if the film is produced without application of a magnetic field, in both cases where the direction of detected magnetic field is parallel with and perpendicular to the direction of the measured current flow, a high rate of change in resistance can be obtained, and the giant magnetoresistive material film having magnetoresistive change characteristics without anisotropy can be obtained.

A magnetic head comprising the giant magnetoresistive material film having the aforementioned structure causes a change in resistance in response to a small magnetic field applied from a magnetic recording medium, thereby enabling reading of magnetic information with high detection sensitivity.

Embodiment

Embodiments of the present invention are described below with reference to the drawings.

FIG. 1 shows a cross-sectional view of a giant magnetoresistive material film in accordance with a first embodiment of the present invention. In this embodiment, a giant magnetoresistive material film D mainly comprises a nonmagnetic substrate 20, and a coercive force increasing layer 21, a ferromagnetic layer 22, a nonmagnetic layer 23, a ferromagnetic layer 24 and a protective layer 25, which are deposited in turn on the substrate 20.

The substrate 20 comprises a nonmagnetic material such as glass, Si, $\text{Al}_2\text{O}_3$, TiC, SiC, a sintered product of $\text{Al}_2\text{O}_3$ and TiO or ferrite. A coating layer or buffer layer may be appropriately provided on the upper surface of the substrate in order to remove irregularity and waviness thereof or improve the crystal conformity of the layer deposited on the substrate.

The coercive force increasing layer 21 exerts magnetic exchange coupling force on the ferromagnetic layer 22 formed thereon to increase the coercive force of the ferromagnetic layer 22. The coercive force increasing layer 21 preferably comprises an antiferromagnetic material, particularly, an antiferromagnetic oxide, for example, $\alpha\text{-Fe}_2\text{O}_3$. The coercive force increasing layer 21 may comprise a hard magnetic material, e.g., a Co-Pt alloy.

Figure 2:
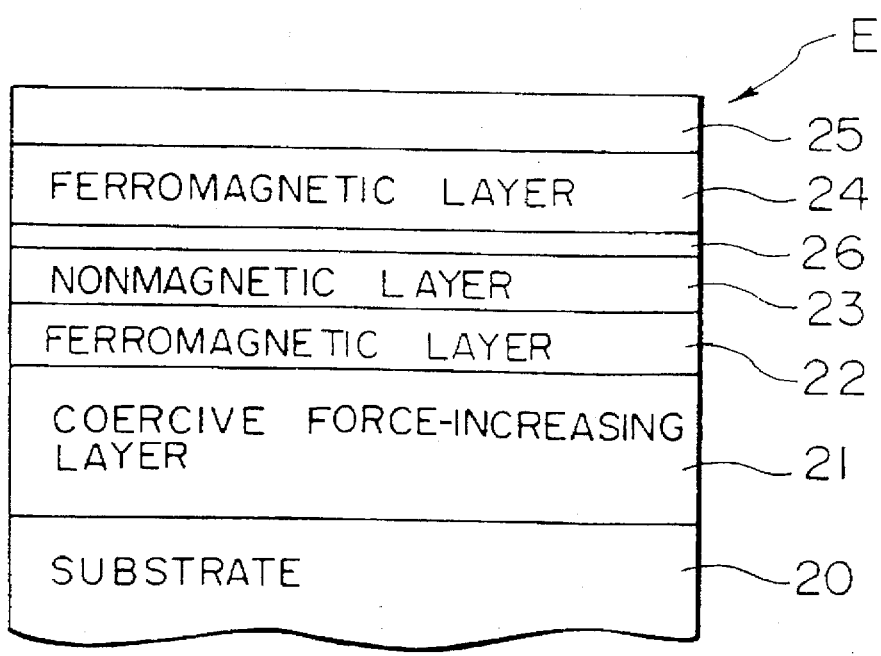
FIG. 2 is a sectional view showing a giant magnetoresistive material film in accordance with a second embodiment of the present invention.

The ferromagnetic layers 22 and 24 comprise a ferromagnetic thin film, for example, consisting of Ni-Co alloy, Ni-Fe-Co alloy or the like. It is also preferable that the ferromagnetic layers 22 and 24 comprise a Co layer and a Ni-Fe alloy layer or a laminar structure comprising a Co layer and a Ni-Fe alloy layer, respectively. In the case of the two-layer structure comprising a Co layer and a Ni-Fe alloy layer, it is preferable to provide a thin Co layer 26 on the side of the nonmagnetic layer 23, as shown in FIG. 2.

This is because, in the giant magnetoresistive effect generating mechanism having a structure comprising the ferromagnetic layers 22 and 24 with the nonmagnetic layer 23 therebetween, a structure comprising the ferromagnetic layers 22 and 24 of the same material has the lower possibility of producing a factor other than spin-dependent confusion of conduction electrons and causes the higher magnetoresistive effect, as compared with a structure comprising different materials. Therefore, when the ferromagnetic layer 22 comprises a Co layer, the structure shown in FIG. 2 is preferred in which a portion of the ferromagnetic layer 24 adjacent to the nonmagnetic layer 23 is replaced by the Co layer having a predetermined thickness. Alternatively, the ferromagnetic layer 24 may comprise an alloy layer with a Co concentration gradient in which the Co concentration is high in a portion adjacent to the nonmagnetic layer 23 and gradually decreases in the direction toward the protective layer 25.

The nonmagnetic layer 23 comprises a nonmagnetic material such as Cu, Cr, Au, Ag or the like and has a thickness of 20 to 40Å. If the nonmagnetic layer 23 has a thickness of 20Å or less, magnetic coupling easily occurs between the ferromagnetic layers 22 and 24. If the nonmagnetic layer 23 has a thickness of 40Å or more, the efficiency of passage of conduction electrons through the interfaces between the nonmagnetic layer 23 and the ferromagnetic layers 22 and 24, which is a factor for producing the magnetoresistive effect, deteriorates, i.e., the magnetoresistive effect is decreased due to the current shunt effect.

Although the protective layer 25 is provided for preventing oxidation of the ferromagnetic layer 24, the protective layer 25 can be omitted when the ferromagnetic layer 24 comprises a material having high corrosion resistance. An insulating overcoat layer may further be provided on the protective layer 25. In this case, the overcoat layer preferably comprises an insulating material such as $\text{Al}_2\text{O}_3$, quartz or the like. When the overcoat layer comprising an insulating material is provided without the protective layer 25 comprising Cu, it is possible to prevent a decrease in the MR value due to the shunt effect (current shunt loss) by the Cu protective layer 25.

In the structure shown in FIG. 1 or 2, the ferromagnetic layer 22 is subjected to magnetic exchange coupling in the presence of the coercive force increasing layer 21 to increase the coercive force of the ferromagnetic layer 22 by fixing the magnetization direction thereof, the other ferromagnetic layer 24 having free magnetization. As a result, a difference in coercive force occurs between the ferromagnetic layers 22 and 24, thereby obtaining the giant magnetoresistive effect. Namely, if an external magnetic field such as a leakage magnetic field from the magnetic recording medium is applied to the ferromagnetic layer 24 having free magnetization, the magnetization direction of the ferromagnetic layer 24 is readily reversed, and the reversal of magnetization causes a change in resistance. Measurement of this change in resistance enables reading of magnetic information on the magnetic recording medium.

Although, in the structures shown in FIGS. 1 and 2, the coercive force increasing layer 21 comprises $\alpha\text{-Fe}_2\text{O}_3$, any materials which exert the magnetic exchange coupling force on the ferromagnetic layer 22 to increase the coercive force thereof can be used as the material for forming the coercive force increasing layer 21. Thus, the coercive force increasing layer may comprise another antiferromagnetic material, an antiferromagnetic oxide or a high-coercive force magnetic material.

The coercive force increasing layer 21 need not be provided on the substrate side, and it may be provided between the protective layer 25 and the ferromagnetic layer 24. In this case, the magnetization of the ferromagnetic layer 24 is pinned, and the ferromagnetic layer 22 has free magnetization.

The giant magnetoresistive material film D having the structure shown in FIG. 1 can be formed by placing the substrate of glass or the like in a chamber of a high-frequency magnetron sputtering apparatus or ion beam sputtering apparatus, producing an atmosphere of inert gas such as Ar gas in the chamber, and then successively forming the required layers on the substrate. The targets required for film formation include a $\alpha$-$Fe_2O_3$ target, a Ni-Fe target and a Cu target. In addition to the above targets, a Co target is required for obtaining the giant magnetoresistive material film E having the structure shown in FIG. 2.

In film formation, the Ar gas pressure is preferably 3 mTorr or less.

The films may be formed with application of a magnetic field to the substrate in an appropriate direction, or without application of a magnetic field.

The present invention can provide the giant magnetoresistive material film exhibiting the high magnetoresistive effect not only with application of a magnetic field but also without application of a magnetic field.

[Production Example]

A giant magnetoresistive material film sample having the structure shown in FIG. 1 was formed by sputtering on a glass substrate (#0100, produced by Matsunami Glass Co., Ltd.) using a high-frequency magnetron sputtering apparatus, a $\alpha$-$Fe_2O_3$ target, a Ni-20 wt % Fe target and a Cu target.

In this example, the coercive force increasing layer 21 comprising $\alpha$-$Fe_2O_3$ had a thickness of 500 Å, the ferromagnetic layer 22 comprising a Ni-Fe alloy had a thickness of 60 Å, the nonmagnetic layer 23 comprising Cu had a thickness of 22 Å, the ferromagnetic layer 24 comprising a Ni-Fe alloy had a thickness of 90 Å, and the protective layer comprising Cu had a thickness of 44 Å. During sputtering, the Ar gas pressure at the time of formation of the coercive force increasing layer 21 of $\alpha$-$Fe_2O_3$ was set to 0.5 mTorr, and the Ar gas pressure in formation of the ferromagnetic layers 22 and 24 of Ni-Fe alloy was set to 3 mTorr. A magnetic field of 100 Oe parallel to the surface of the substrate was applied to the substrate.

Figure 3:
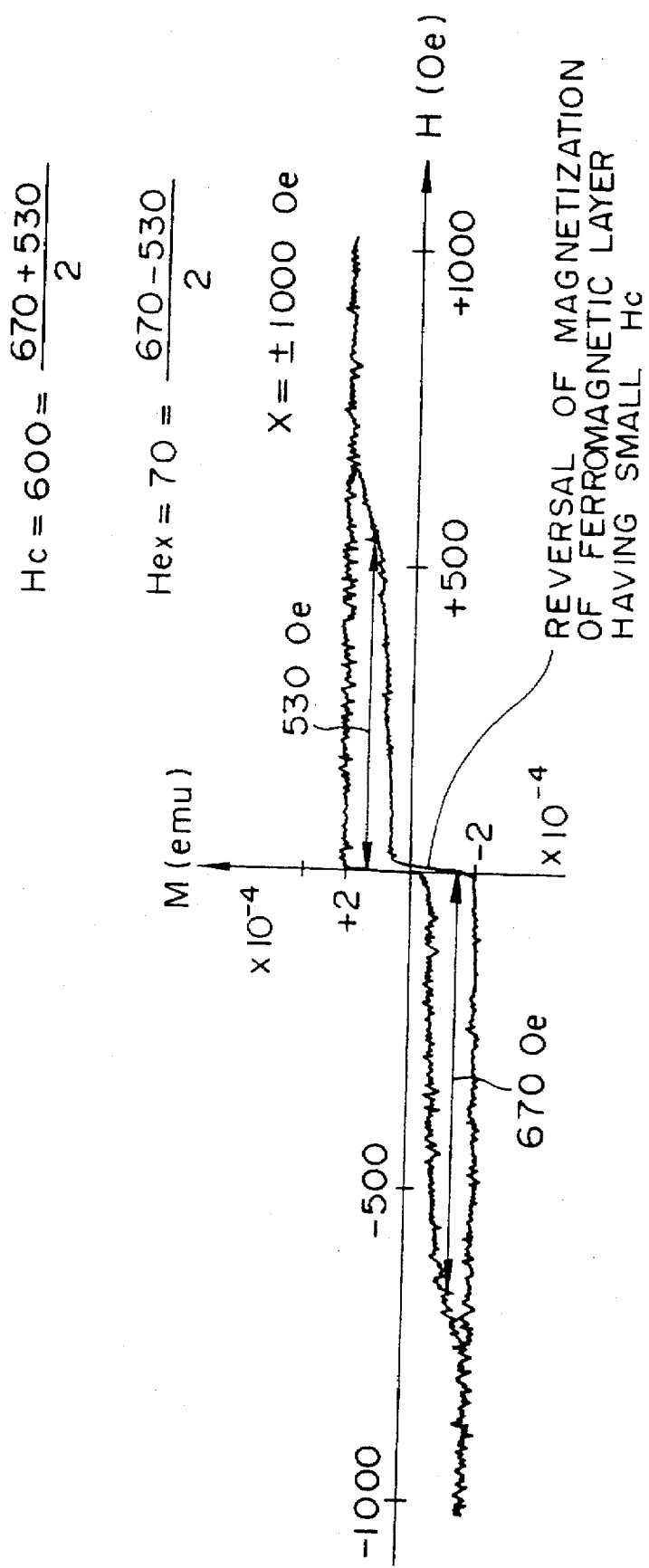
FIG. 3 is a graph showing the M-H curve of the sample obtained in a production example.

In measurement of the M-H curve of the obtained sample using VSM (Vibrating Sample Magnetometer), the results shown in FIG. 3 were obtained.

The results shown in FIG. 3 reveal that the M-H curve is a two-step M-H curve synthesized by superposing the characteristics of the ferromagnetic layer 22 of Ni-Fe alloy which is subjected to exchange coupling to the coercive force increasing layer 21 of $\alpha$-$Fe_2O_3$ as an antiferromagnetic layer to increase the coercive force, and the characteristics of the ferromagnetic layer 24 of Ni-Fe alloy with small coercive force (Hc) which shows abrupt reversal of magnetization at substantially zero magnetic field through the nonmagnetic layer 23 of Cu.

From the results shown in FIG. 3, Hc and Hex can be calculated as follows:

Hc=(670+530)/2=600 Oe
Hex=(670−530)/2=70 Oe

In the fourth quadrant in FIG. 3, abrupt rising from a value close to $-2 \times 10^{-4}$ emu on the ordinate shows the reversal of magnetization of the ferromagnetic layer 24 of Ni-Fe alloy having small coercive force.

Figure 4:
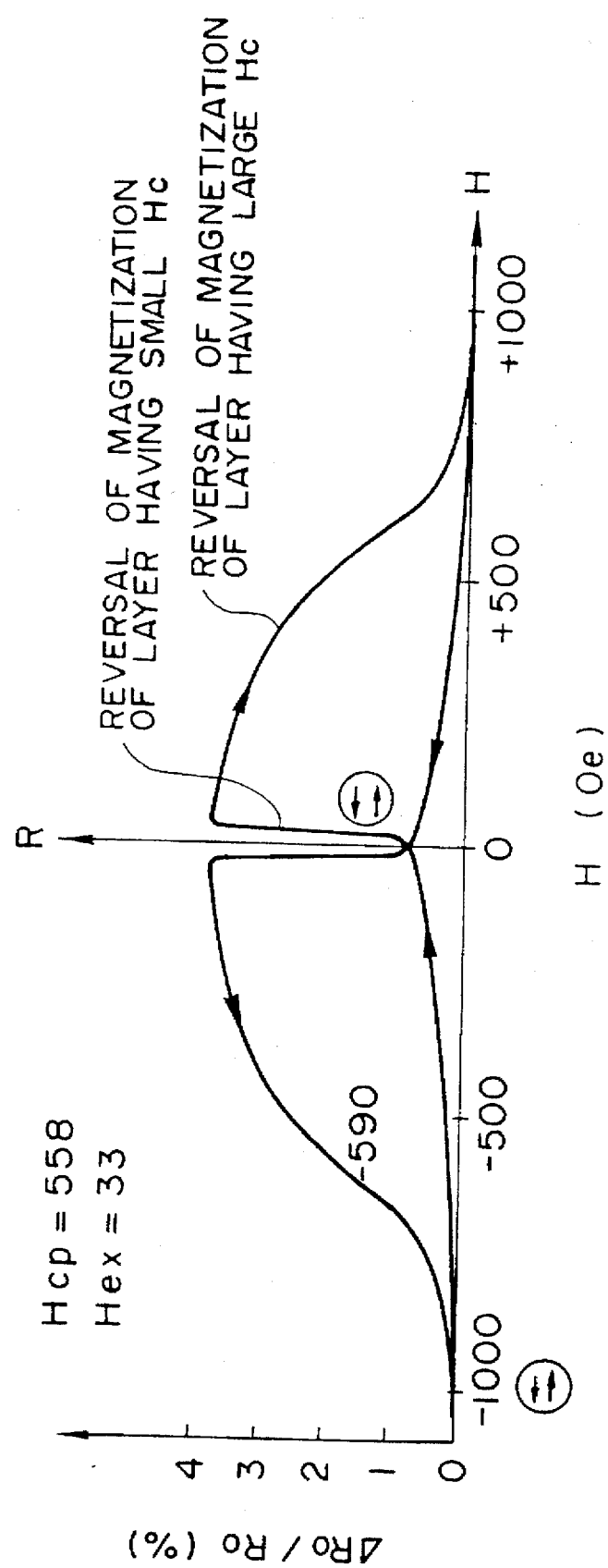
FIG. 4 is a graph showing the R-H curve of the sample obtained in the production example.

As result of measurement of the R-H characteristics of the sample by using a four-terminal resistance meter with application of a magnetic field, the R-H curve shown in FIG. 4 was obtained. As shown by the curve in FIG. 4, the resistance is abruptly changed at a point close to zero magnetic field due to the reversal of magnetization of the ferromagnetic layer 24 having small coercive force (Hc). This phenomenon is based on spin-dependent confusion of conduction electrons which is caused by parallel alignment between the magnetization directions of the ferromagnetic layers 24 and 22. With the sample shown in the figure, a rate of change in resistance $\Delta R/R$ of 3.8% was obtained.

Figure 5:
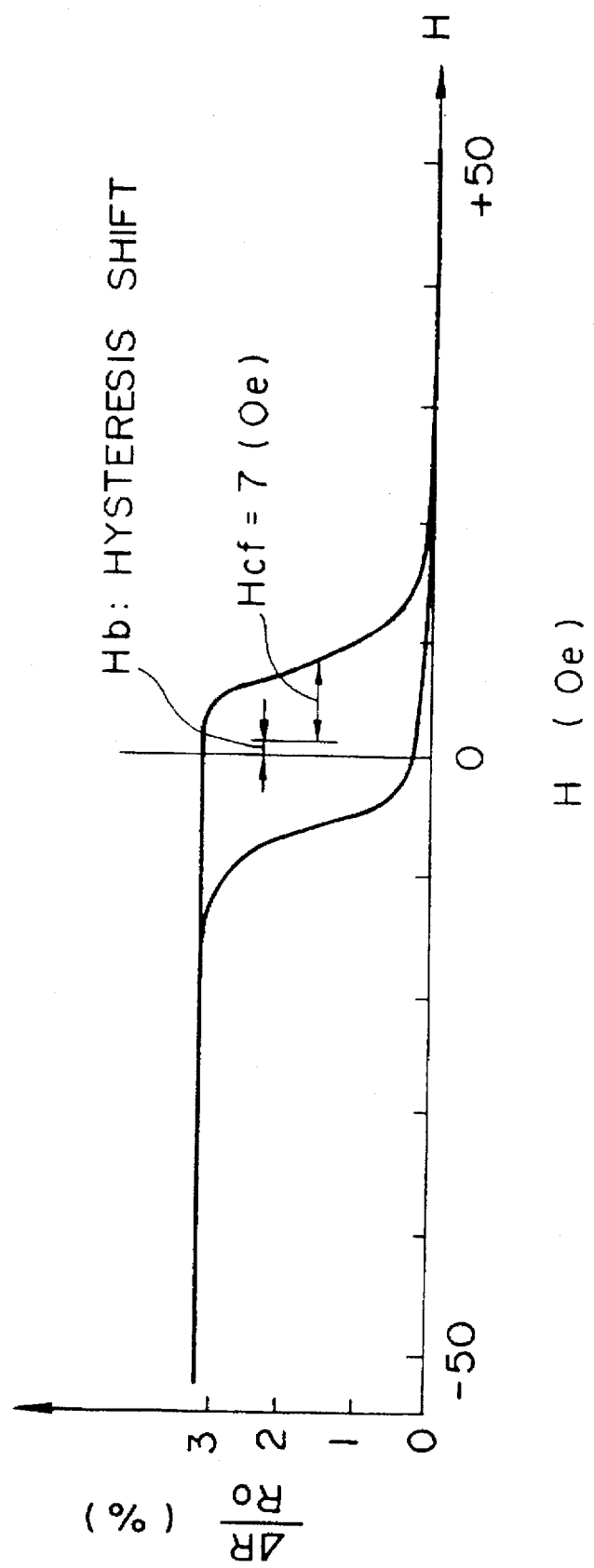
FIG. 5 is a graph showing the R-H minus curve of the sample obtained in the production example.

FIG. 5 shows the R-H minus curve obtained by vibrating an external magnetic field at a point (±50 Oe) close to zero magnetic field after applying a magnetic field of 1 kOe to the sample in the + direction. The curve shown in FIG. 5 indicates that the coercive force (Hcf) of the ferromagnetic layer 24 showing the reversal of magnetization at a low magnetic field is about 7 Oe, and the hysteresis shift (Hb) caused by the coupled magnetic field between the ferromagnetic layers 22 and 24 is a value very close to zero.

Table 1 shows the results of comparison of the characteristics obtained from the above sample with characteristics of a conventional giant magnetoresistive material sample (Comparative Example). In Table 1, each of the Ni-Fe alloy layer and the Cu layer in the structure of the comparative example had the same thickness as that of the example of this invention.

TABLE 1

| | Layer structure | ΔMR | $H_B$ | Hcf | Hb |
|---|---|---|---|---|---|
| Comparative Example | 1) NiFe/ Cu/FiNe/ FeMn (110Å) | 4.2% | 200 | 1.0 | 18 |
| | 2) NiFe/ Cu/CoPt (80Å) | 4.4% | 1000 | 50 | 30 |
| Example of this invention | 3) $\alpha$-$Fe_2O_3$/ NiFe/Cu/ NiFe | 6.0% | 500 | 7 | ≈0 |

In Table 1, $H_B$ (unit Oe) represents the blocking magnetic field, Hcf (unit Oe) represents the coercive force of the ferromagnetic field showing reversal of magnetization at a low magnetic field, and Hb represents a hysteresis shift.

In Table 1, the sample of the present invention shows the maximum value of ΔMR. This is because the coercive force increasing layer of $\alpha$-$Fe_2O_3$ comprises an oxide film and has high insulating properties, thereby causing the low shunt effect (current shunt loss). The blocking magnetic field is a magnetic field at which magnetization of the Ni-Fe alloy layer subjected to exchange coupling to the anitferromagnetic layer or the high-coercive force magnetic layer is reversed, and is preferably large. The sample of Conventional Example 1 has the defect that $H_B$ is low, and Hb is high, and the sample of Conventional Example 2 has the defect that both Hcf and Hb are high. It is obvious from the table that the sample 3 of the present invention is a giant magnetoresistive material having none of the defects of the conventional example and a high value of ΔMR.

It is apparent that the sample of the present invention has excellent characteristics as compared with any conventional structures.

Figure 6:
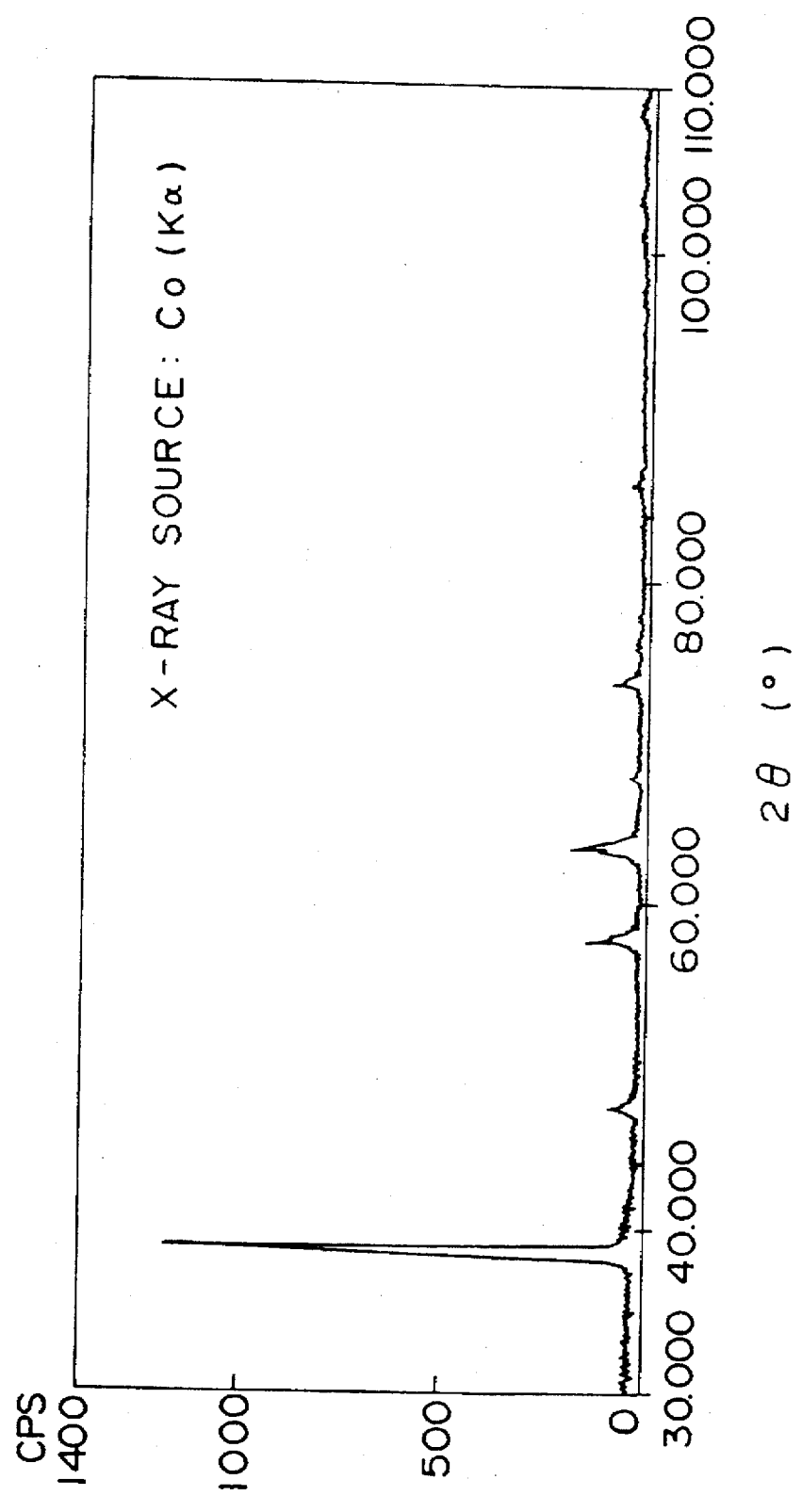
FIG. 6 is a chart showing the result of X-ray diffraction of the layer of $\alpha$-$Fe_2O_3$ obtained in the production example.

FIG. 6 shows the X-ray diffraction data of the coercive force increasing layer of α-Fe$_2$O$_3$ which has a thickness of 1000 Å and is formed on a substrate according to the present invention. Measurement was performed by using Co(Kα) as a X-ray source under the conditions of a voltage of 40 kV, a current of 20 mA and a scanning speed of 1.00°/min. The data shown in the figure reveals that the coercive force increasing layer of the present invention comprises an antiferromagnetic material α-Fe$_2$O$_3$.

Figure 7:
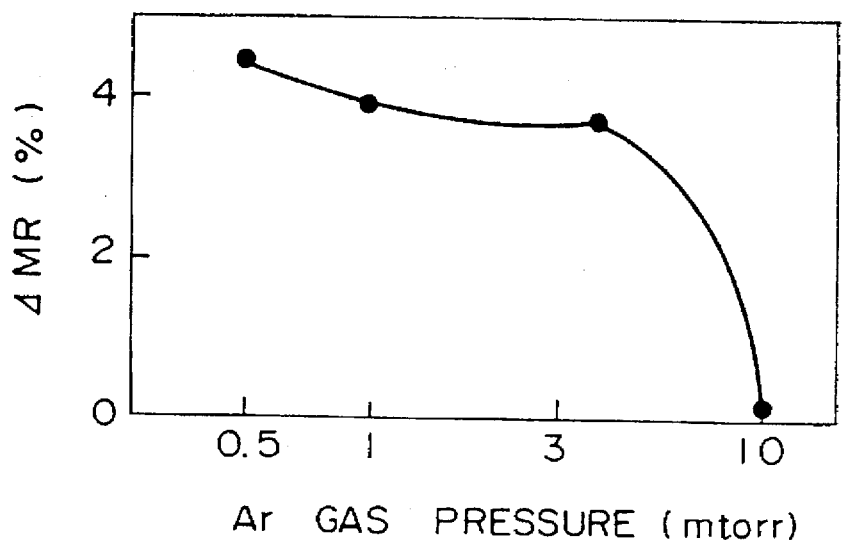
FIG. 7 is a graph showing the relation between Ar gas pressure and $\Delta$MR at the time of film formation in the production example.
Figure 8:
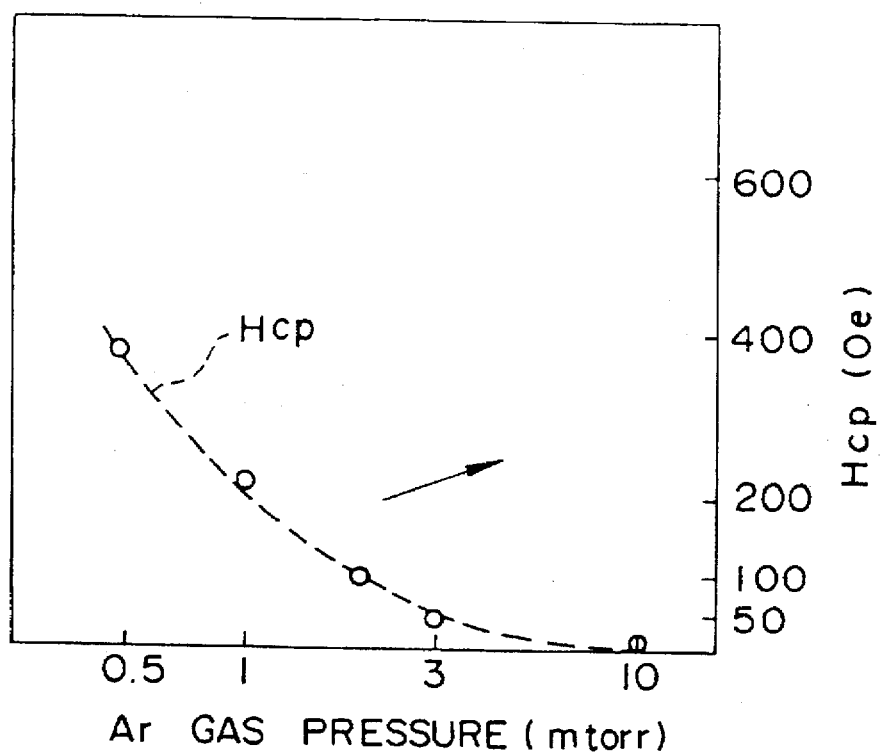
FIG. 8 is a graph showing the relation between Ar gas pressure and coercive force at the time of film formation in the production example.

FIGS. 7 and 8 show the MR characteristics obtained in investigation of conditions for forming the coercive force increasing layer comprising α-Fe$_2$O$_3$. FIG. 7 shows the relation between Ar gas pressure and ΔMR during film formation, and FIG. 8 shows the relation between Ar gas pressure and coercive force Hc during film formation. The entire structure of a giant magnetoresistive material film was the same as that shown in FIG. 1.

The results shown in FIG. 7 indicate that, under a high Ar gas pressure at the time of film formation, the coercive force (Hcp) of the ferromagnetic layer of NiFe adjacent to the coercive force increasing layer of α-Fe$_2$O$_3$ decreases, and ΔMR (=ΔR/R) decreases. Particularly, FIG. 7 shows that ΔMR abruptly deceases at a gas pressure of 3 mTorr or more. This indicates that the Ar gas pressure is preferably 3 mTorr or less in order to stably obtain a value of ΔMR.

Since Hcp must be increased for increasing the blocking magnetic field H$_B$, the Ar gas pressure must be not more than 3 mTorr, as seen from FIG. 8. However, in consideration of the result that the blocking magnetic field of the sample comprising antiferromagnetic material FeMn is 200, as the Conventional Example 1 shown in Table 1, if H$_B$>200 Oe, it is apparent that the Ar gas pressure must be not more than 1 mTorr, preferably not more than 0.5 mTorr.

Figure 9:
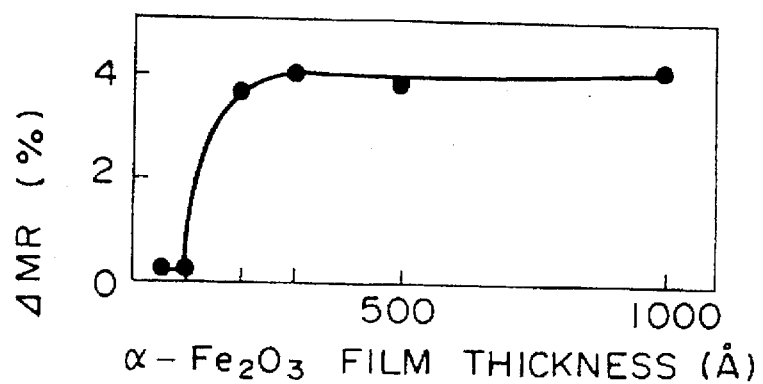
FIG. 9 is a graph showing the relation between the thickness of a $\alpha$-$Fe_2O_3$ layer and $\Delta$MR.
Figure 10:
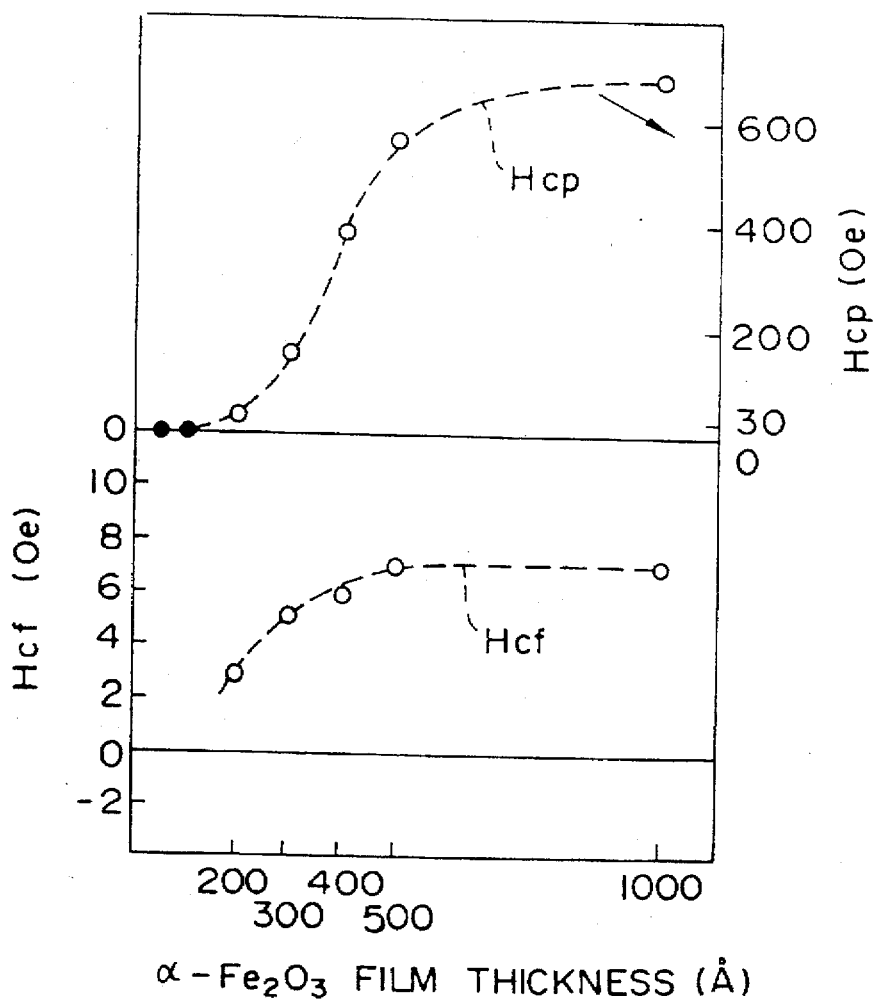
FIG. 10 is a graph showing the relation between the thickness of a $\alpha$-$Fe_2O_3$ layer and $H_{cp}$ and $H_{cf}$.

FIGS. 9 and 10 show the MR characteristics obtained by changing the thickness of the coercive force increasing layer of α-Fe$_2$O$_3$ from 50 Å to 1000 Å. The results shown in each of the figures indicate that a predetermined thickness is required for increasing the coercive force Hcp of the ferromagnetic layer of NiFe adjacent to the coercive force increasing layer.

FIG. 9 shows that the thickness of the coercive force increasing layer must be at least 200 Å for stably obtaining ΔMR, and if H$_B$>200 Oe, the thickness must be not less than 350 Å. However, with a thickness of 500 to 1000 Å, Hcp tends to be saturated, and a thickness of over 1000 Å is thought to be useless. It is thus found that the thickness of the coercive force increasing layer is preferably within the range of 200 to 1000 Å, more preferably within the range of 350 to 1000 Å.

When the giant magnetoresistive material film is applied to a magnetic head, an MR element comprising the giant magnetoresistive material film is provided so as to be sandwiched between a shield layer and an insulating layer, and thus the coercive force increasing layer of α-Fe$_2$O$_3$ having a thickness of not more than 1000 Å causes no problem. FIG. 10 indicates that Hcf showing hysteresis of the ferromagnetic layer showing reversal of magnetization at a low magnetic field in a minor loop is not more than 7 Oe.

Figure 11:
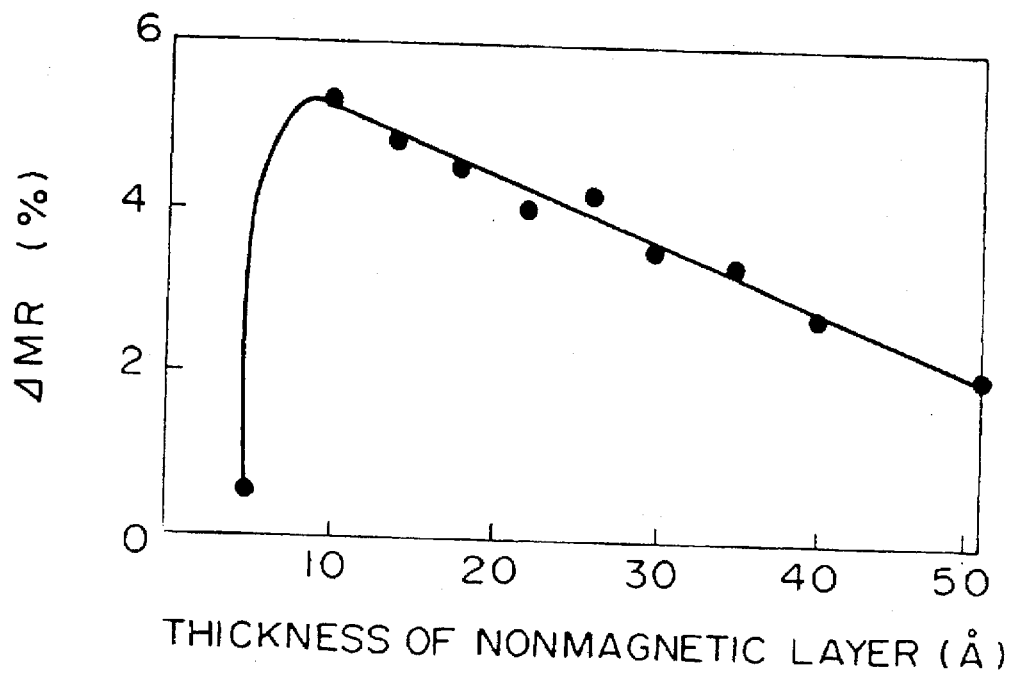
FIG. 11 is a graph showing the relation between the thickness of a nonmagnetic layer and $\Delta$MR.

The same method as the above-described method of forming the sample was performed for forming a sample comprising a glass substrate, and a coercive force increasing layer of α-Fe$_2$O$_3$ having a thickness of 500 Å, a ferromagnetic layer of NiFe alloy having a thickness of 60 Å, a nonmagnetic layer of Cu having a predetermined thickness, a ferromagnetic layer of NiFe alloy having a thickness of 87 Å, and a coating layer of Cu having a thickness of 44 Å, which are deposed on the substrate. FIG. 11 shows the results of examination of the dependency of the ΔMR value on the thickness of the nonmagnetic layer of Cu of this sample.

The results shown in FIG. 11 indicate that the thickness of the nonmagnetic layer of Cu is preferably within the range of 10 to 50 Å, more preferably within the range of 10 to 30 Å, for increasing ΔMR.

FIG. 11 shows the values of Hbf and Hcf measured using the same sample as that shown in FIG. 11. The results shown in FIG. 12 indicate that the thickness of the nonmagnetic layer of Cu is preferably not less than 20 Å for decreasing the bias magnetic field (Hbf) applied to the ferromagnetic layer of NiFe alloy having free magnetization.

Figure 12:
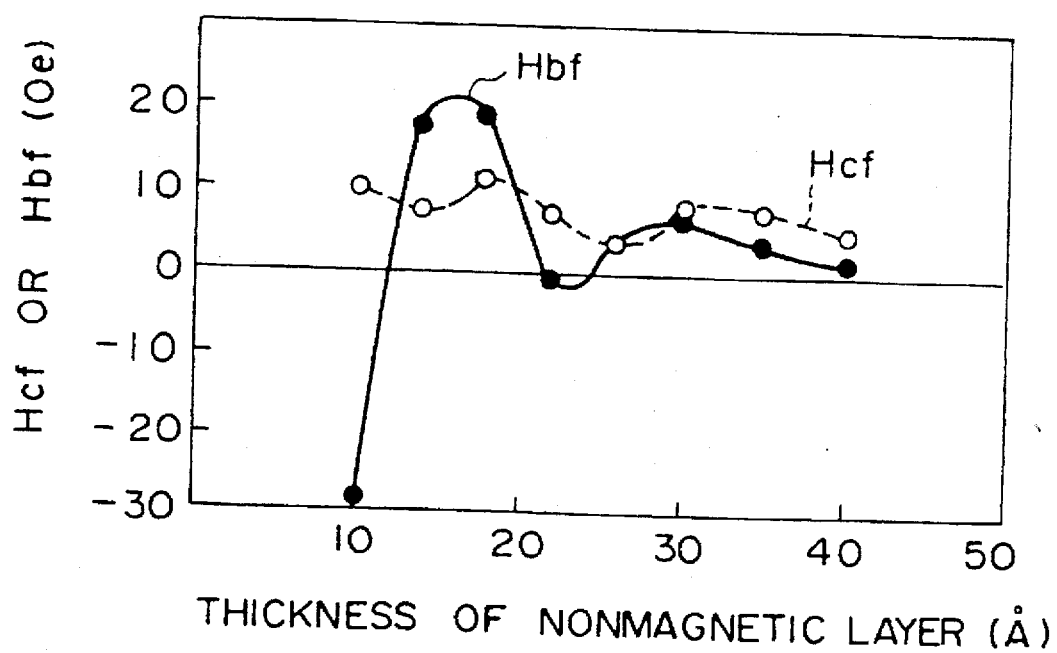
FIG. 12 is a graph showing the relation between the thickness of a nonmagnetic layer and $H_{bf}$ and $H_{cf}$.

It was found from the results shown in FIGS. 11 and 12 that the thickness of the nonmagnetic layer of Cu is preferably within the range of 10 to 50 Å, and most preferably within the range of 20 to 30 Å.

Figure 13:
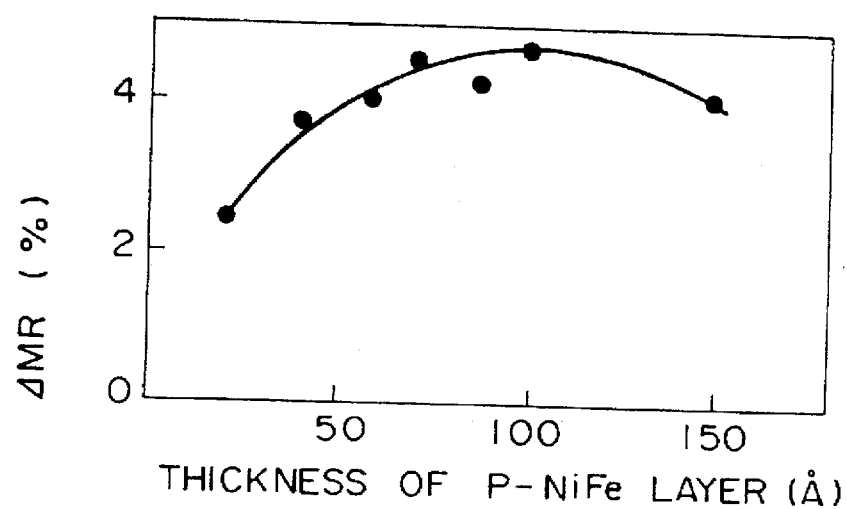
FIG. 13 is a graph showing the relation between the thickness of a ferromagnetic layer adjacent to a coercive force increasing layer and $\Delta$MR.

The same method as that for forming the above samples was performed for forming a sample comprising a glass substrate, and a coercive force increasing layer of α-Fe$_2$O$_3$ having a thickness of 500 Å, a ferromagnetic layer of NiFe alloy having a predetermined thickness (the magnetization direction of the layer is pinned by the coercive force increasing layer: shown by P-NiFe layer in FIG. 13), a nonmagnetic layer of Cu having a thickness of 22 Å, a ferromagnetic layer of NiFe alloy having a thickness of 87 Å, and a coating layer of Cu having a thickness of 44 Å, which are deposited on the substrate. FIG. 13 shows the results of examination of the dependency of the ΔMR value on the thickness of the nonmagnetic layer of Cu.

The results shown in FIG. 13 indicate that the thickness of the ferromagnetic layer of NiFe alloy adjacent to the coercive force increasing layer is preferably within the range of 40 to 150 Å for increasing ΔMR.

Figure 14:
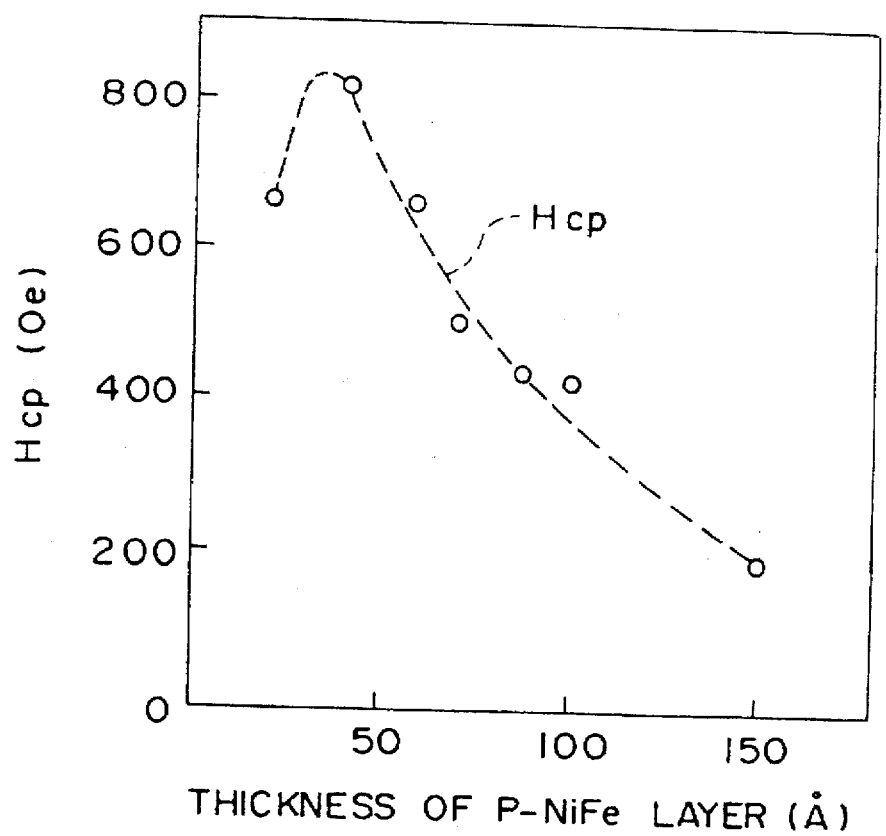
FIG. 14 is a graph showing the relation between the thickness of a ferromagnetic layer adjacent to a coercive force increasing layer and $H_{cp}$.

FIG. 14 shows the Hcp values measured by using the same sample that shown in FIG. 13. It is found from the results shown in FIG. 14 that in order to increase the coercive force (Hcp) of the ferromagnetic layer of NiFe alloy having fixed magnetization, i.e, increase the coercive force to 200 Oe or more, the thickness of the ferromagnetic layer is preferably not more than 150 Å.

The results shown in FIGS. 13 and 14 reveal that the thickness of the nonmagnetic layer of Cu is preferably not more than 150 Å, and most preferably within the range of 40 to 150 Å.

Figure 15:
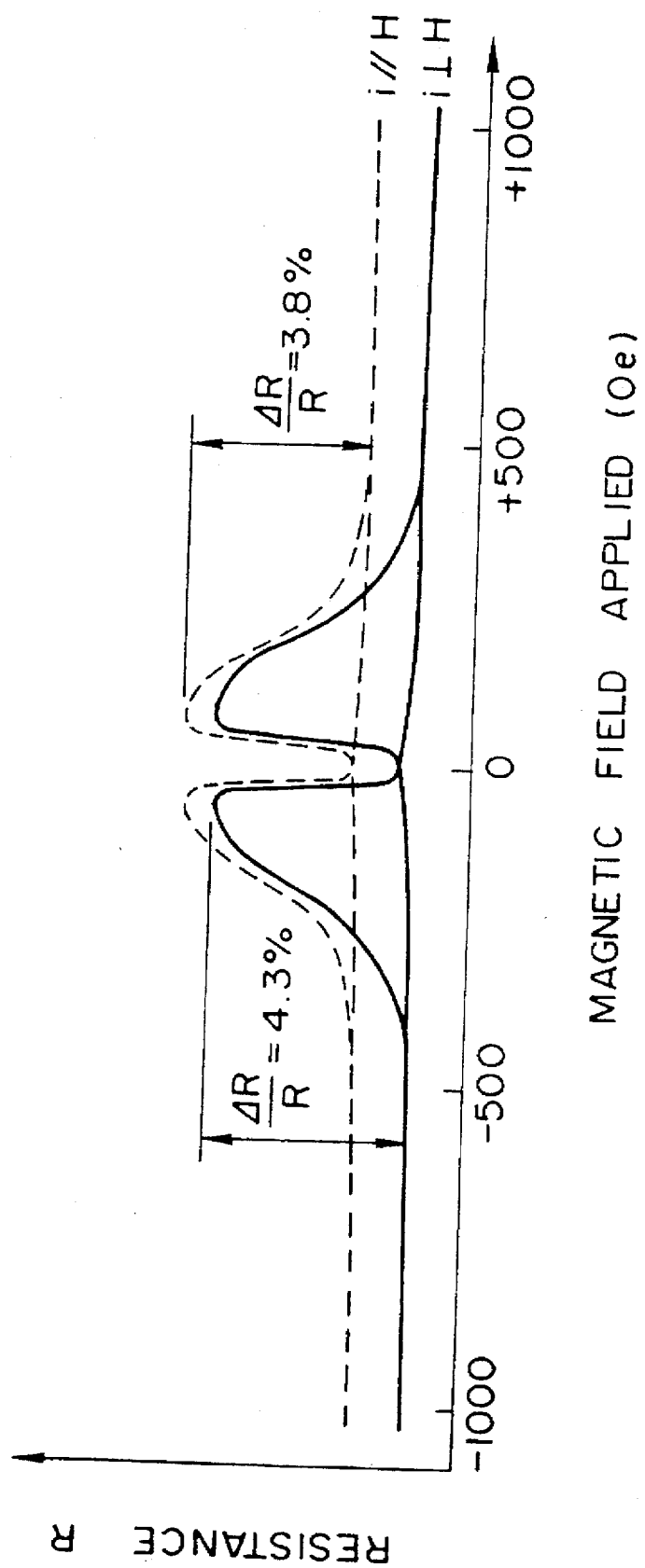
FIG. 15 is a graph showing changes in resistance when a film is formed on a surface of a substrate without application of a magnetic field.
Figure 16:
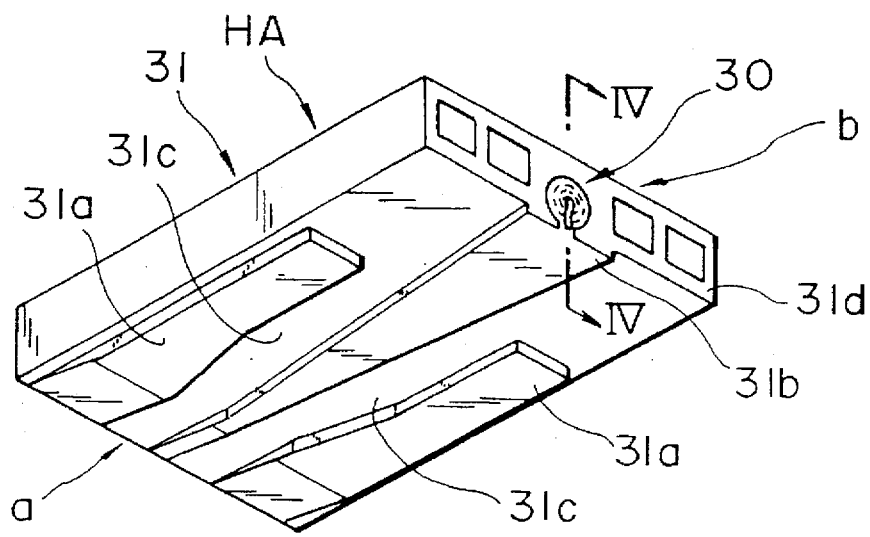
FIG. 16 is a perspective view of a magnetic head in accordance with the present invention.

Although, in the aforementioned production method, a film was formed with application of a magnetic field of 100 Oe parallel with the surface of the glass substrate, a sample having the structure shown in FIG. 1 was formed without application of a magnetic field, and R-H characteristics of this sample were measured. The results of measurement are shown in FIG. 15. In FIG. 15, a chain line curve shows the case wherein the detected magnetization direction is parallel with the measured current flow direction (i//H), and a solid line curve shows the case wherein the detected magnetization direction is perpendicular to the measured current direction (i⊥H).

In the case wherein the detected magnetization direction is perpendicular to the measured current direction (i⊥H), the ratio of change in resistance (ΔR/R) is slightly higher than that in the other case due to the contribution of the anisotropic magnetoresistive effect possessed by the ferromagnetic layer of NiFe alloy. However, in both cases, the value of R/R is equivalent to or higher (4.3%) than 3.8% obtained in film formation with application of a magnetic field.

The structure of the present invention thus permits the achievement of a giant magnetoresistive material film having excellent characteristics even if a magnetic field is not applied at the time of film formation.

However, for a conventional giant magnetoresistive material film comprising an antiferromagnetic layer of FeMn, in order to provide the antiferromagnetic layer with one-direction anisotropy, a magnetic field must be applied during film formation, or annealing treatment must be performed in a magnetic field at the blocking temperature (the temperature at which one directivity is lost and corresponding to the Neél temperature of a bulk material. It is about 150° C. for FeMn alloy, and about 250° C. for NiO). However, film formation in a magnetic field deteriorates the distribution of the film thickness, makes unstable the rate of film formation, and requires an additional special magnetic field application mechanism for the film formation apparatus. If possible, it is thus desired to avoid the film formation in a magnetic field. Annealing in a magnetic field is also unfavorable because this causes deterioration in characteristics due to an increase in number of the steps, oxidation or interfacial diffusion. In addition, the conventional giant magnetoresistive material film comprising an antiferromagnetic layer of FeMn exhibits high sensitivity of detection of a magnetic field in only one direction, and has the problem of decreasing the detection output if the direction is shifted.

On the other hand, the giant magnetoresistive material film of the present invention has no need for film formation in a magnetic field and no directivity of detection of a magnetic field, and thus has excellent characteristics.

FIGS. 16 through 19 show an example of the structure of a thin film magnetic head comprising the giant magnetoresistive material film of the present invention.

In this example, a magnetic head HA is a floating type magnetic head to be loaded on a hard disk device or the like. A slider 31 of the magnetic head HA has the leading side denoted by (a) in FIG. 16 on the upstream side in the direction of movement of the disk surface, and the trailing side denoted by (b) in FIG. 16. On the surface of the slider 31 opposite to a disk are formed rail-formed ABS surfaces 31a and 31b, and an air groove 31c. A thin film magnetic head 30 is provided on the end surface 31d of the slider 31 on the trailing side thereof.

Figure 17:
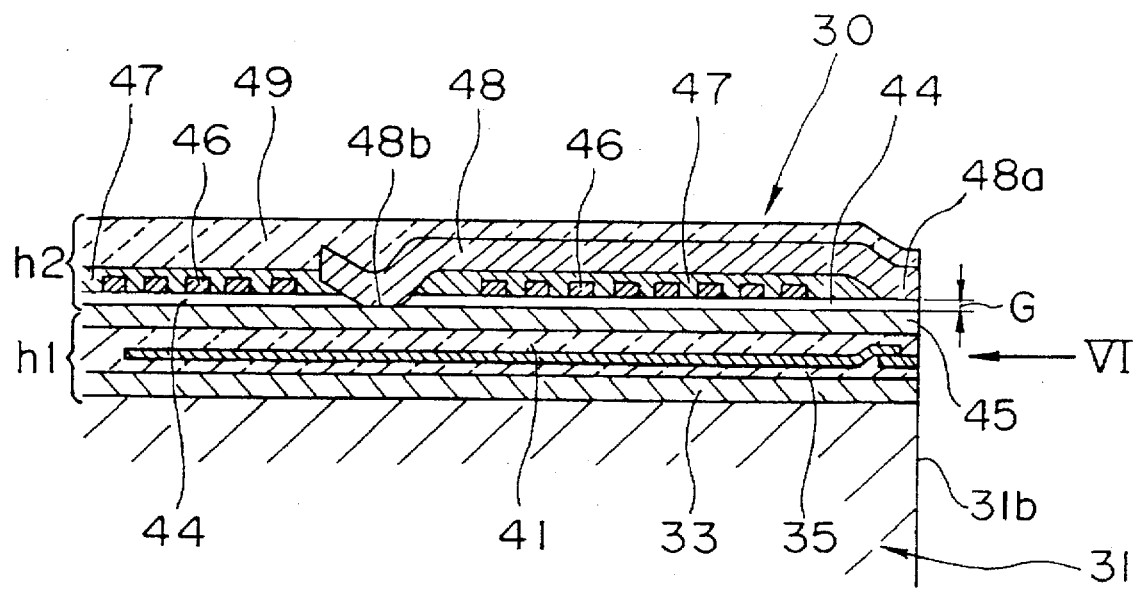
FIG. 17 is a sectional view showing a principal portion of the magnetic head shown in FIG. 16.
Figure 18:
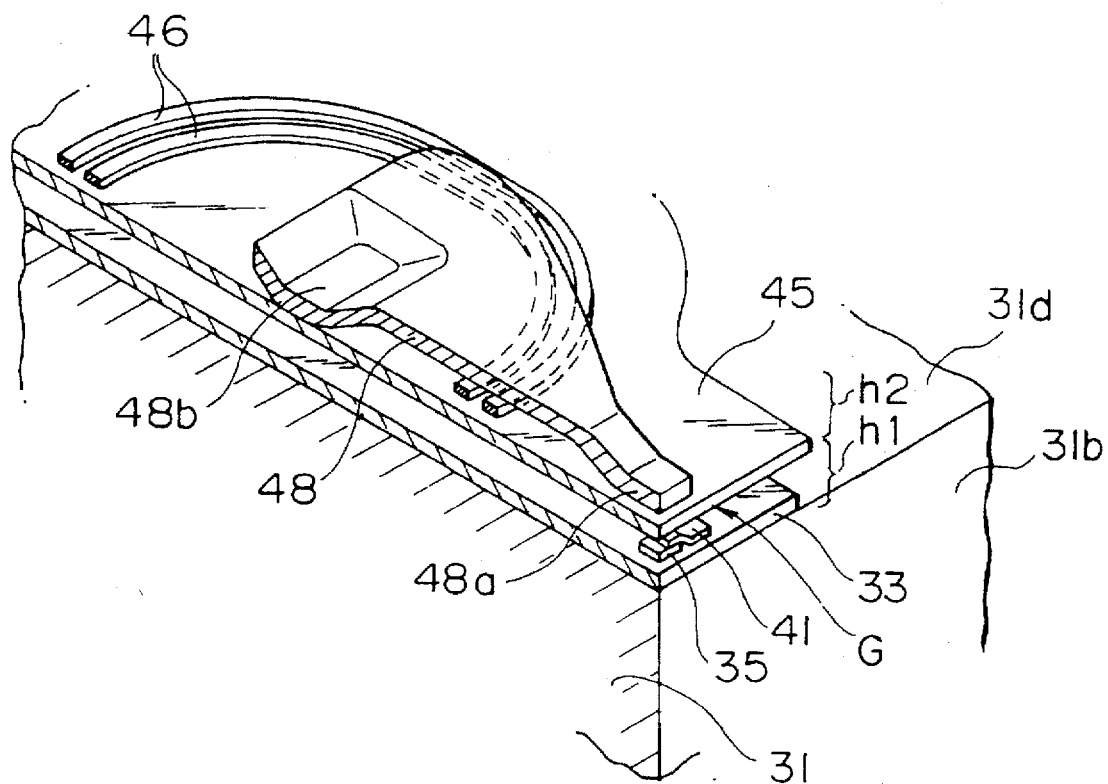
FIG. 18 is a partially sectional perspective view of the magnetic head shown in FIG. 16.

The thin film magnetic head 30 of this example is a composite magnetic head having the sectional structures shown in FIGS. 17 and 18, comprising a MR head (reading head) $h_1$ and an inductive head (writing head) $h_2$ which are laminated in turn on the end surface 31d of the slider 31 on the trailing side thereof.

Figure 19:
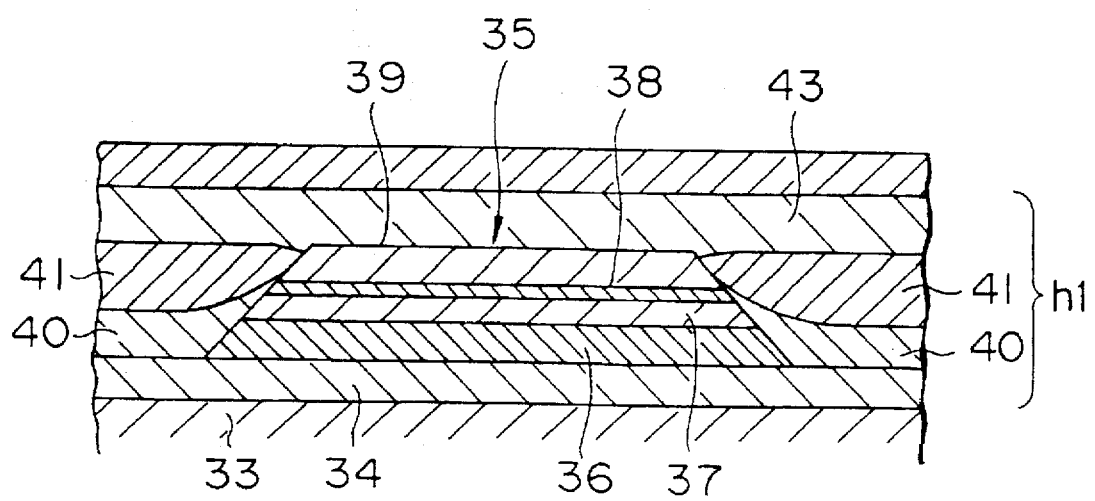
FIG. 19 is an enlarged sectional view showing a principal portion of the magnetic head shown in FIG. 16.

The MR head $h_1$ detects the leakage flux from a recording medium such as a disk or the like by employing the magnetoresistive effect to read a magnetic signal. The MR head $h_1$ comprises a lower shield layer 33 comprising a magnetic alloy such as Sendust (Fe-Al-Si) and an upper gap layer 34 comprising a nonmagnetic material such as alumina ($Al_2O_3$), both of which are formed on the trailing side end of the slider 31, as shown in FIG. 19.

A giant magnetoresistive material film 35 is deposited on the upper gap layer 34. The giant magnetoresistive material film 35 has a four-layer structure comprising a coercive force increasing layer 36 of $\alpha$-$Fe_2O_3$, a ferromagnetic layer 37 of NiFe alloy, a nonmagnetic layer 38 of Cu and a ferromagnetic layer 39 of NiFe alloy, which are formed in this order from the lower side.

A hard bias layer 40 for providing the film 35 with a bias magnetic field, and an electrode layer 41 for supplying detection current are formed on both sides of the giant magnetoresistive material film 35. An upper gap layer 43 comprising alumina is formed on the giant magnetoresistive material film 35, and an upper shield layer is further formed on the upper gap layer 43. The upper shield layer is also used as a lower core layer 45 of the inductive head $h_2$ provided thereon.

The inductive head $h_2$ comprises a gap layer 44 formed on the lower core layer 45, and a coil layer 46 which is patterned in a spiral form and which formed on the gap layer 44, the coil layer 46 being surrounded by an insulating material layer 47. An upper core layer 48 is formed on the insulating material layer 47 so that the end 48a thereof is opposed to the lower core layer 45 with a small gap therebetween on the ABS surface 31b, and the base end 48b thereof is magnetically connected to the lower core layer 45. A protective layer 49 comprising alumina is provided on the upper core layer 48.

In the inductive head $h_2$, a recording current is supplied to the coil layer 46, and the recording current is supplied to the core layer from the coil layer 46. A magnetic signal can be recorded on a recording medium such as a hard disk or the like by using a leakage magnetic field from magnetic gap G between the lower core layer 45 and the end 48a of the upper core layer 48.

In the MR head $h_1$, since the resistance of the ferromagnetic layer 39 is changed by the presence of a small leakage magnetic field from the recording medium such as a hard disk or the like, a record content of the recording medium can be read by reading the change in resistance.

Since the magnetic head HA configured as described above comprises the giant magnetoresistive material film 35 having the above-described structure, it can obtain a higher MR ration than a conventional magnetic head, and thus has excellent reading performance.

Figure 20:
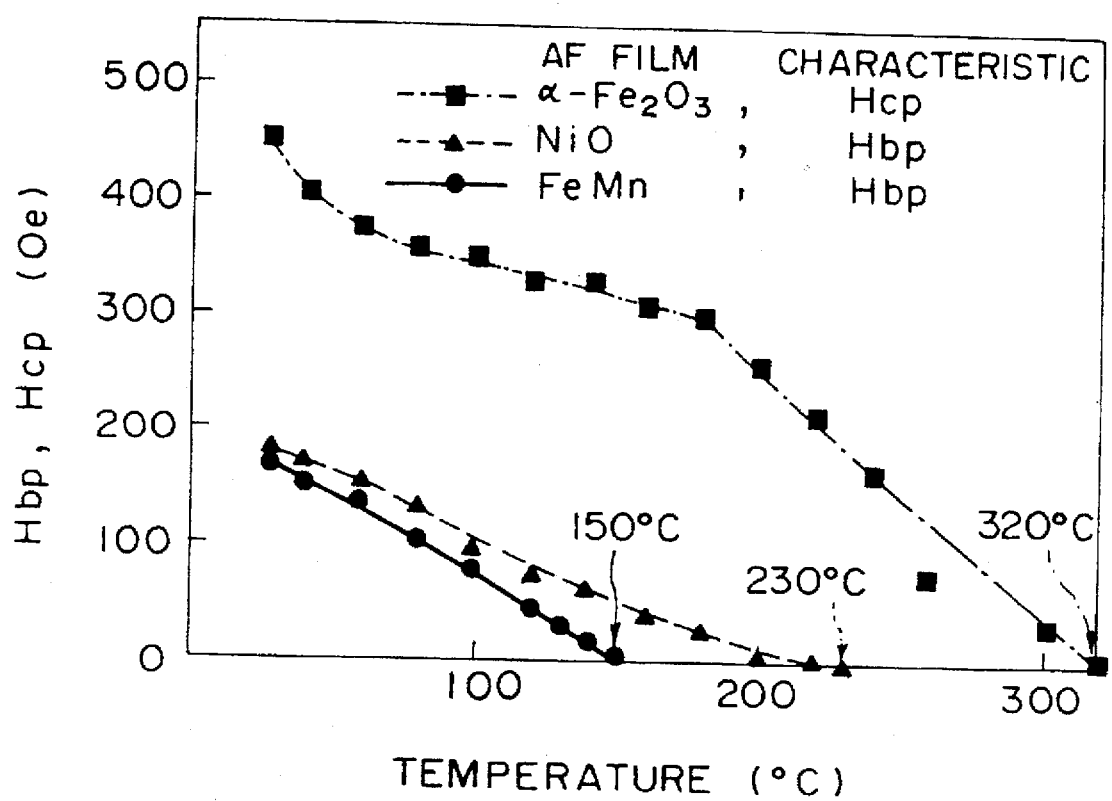
FIG. 20 is a graph showing the results of measurement of the blocking temperature $T_B$ in each of antiferromagnetic films respectively comprising FeMn, NiO and $\alpha$-$Fe_2O_3$.

FIG. 20 shows the blocking temperature $T_B$ of the sample of the giant magnetoresistive material film comprising $\alpha$-$Fe_2O_3$, which was obtained in the above production example. For comparison, the temperature characteristics of the sample of Conventional Example 1 shown in Table 1, which comprises FeMn, and a sample comprising NiO in place of FeMn, are also shown in FIG. 20. In FIG. 20, $H_{bp}$ shows the bias magnetic field at which the reversal of magnetization of the NiFe film adjacent to the antiferromagnetic layer is shifted, and $H_{cp}$ shows the coercive force due to hysteresis.

The results shown in FIG. 20 indicate that the sample of the present invention has excellent heat resistance. This is possibly caused by the fact that the Neél temperature (677° C.) of $\alpha$-$Fe_2O_3$ is higher than those of FeMn and NiO.

Figure 21:
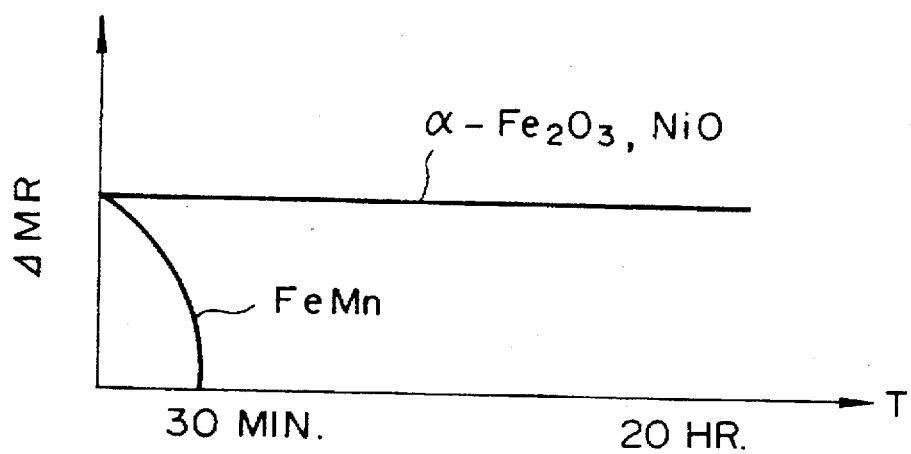
FIG. 21 is a graph showing corrosion resistance of each of the antiferromagnetic films respectively comprising FeMn, NiO and $\alpha$-$Fe_2O_3$.
Figure 22:
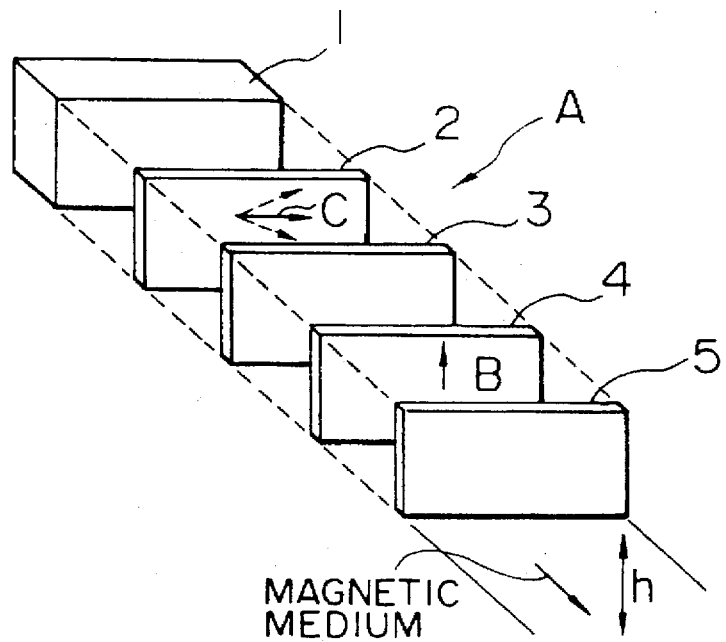
FIG. 22 is an exploded view showing a first example of multilayer films for conventional magnetoresistive devices.
Figure 23:
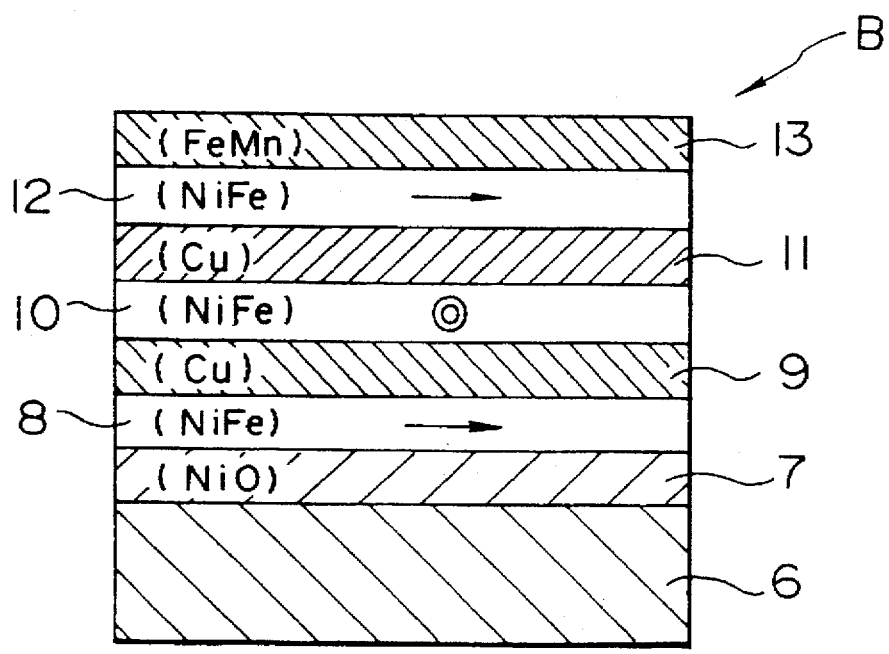
FIG. 23 is a sectional view showing a second example of multilayer films for conventional magnetoresistive devices.
Figure 24:
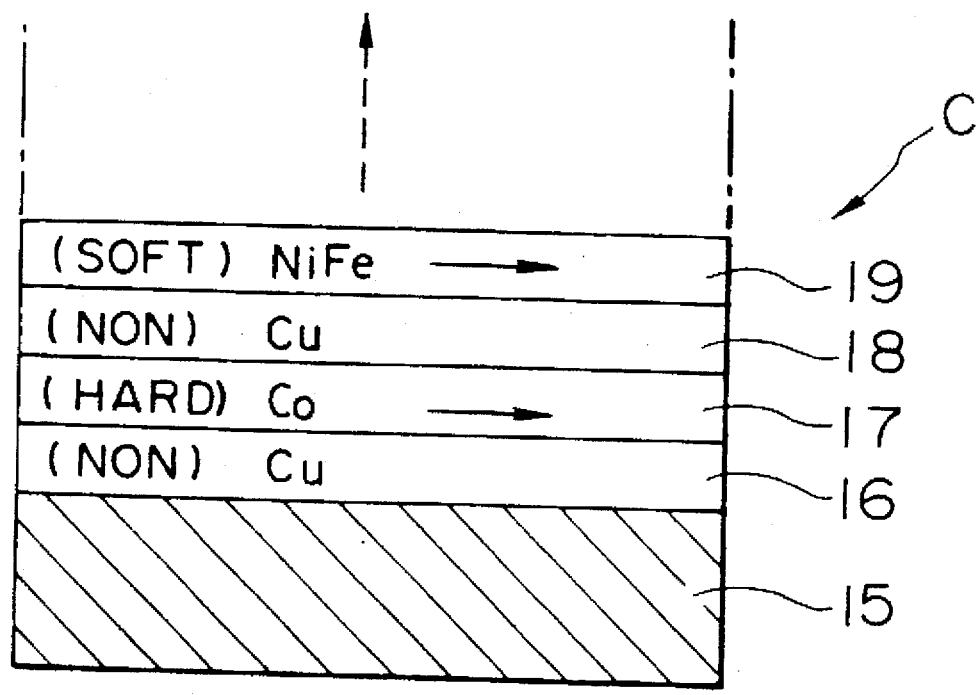
FIG. 24 is a sectional view showing a third example of multilayer films for conventional magnetoresistive devices.

FIG. 21 shows the results of a test of corrosion resistance of the giant magnetoresistive material film comprising $\alpha$-$Fe_2O_3$ and obtained in the above production example. For comparison, the corrosion resistance of the sample of Conventional Example 1 shown in Table 1, which comprises FeMn, and a sample comprising NiO in place of FeMn, are also shown in FIG. 21. In this test, after a sample was dipped in pure water for a predetermined time, taken out and then dried, $\Delta$MR was measured again. FIG. 21 shows the relation between a ratio of deterioration in $\Delta$MR characteristic and the dipping time.

The results shown in FIG. 20 reveal that the sample of the present invention has excellent corrosion resistance. This is possibly caused by the excellent corrosion resistance of an oxide $\alpha$-$Fe_2O_3$, as compared with FeMn.

What is claimed is:

1. A method of producing a giant magnetoresistive material film comprising:

forming a coercive force increasing layer of $\alpha$-Fe$_2$O$_3$ on a substrate by sputtering in an Ar gas atmosphere under a pressure of 3 mTorr or less with application of a magnetic field; and forming at least two ferromagnetic layers on the coercive force increasing layer with a nonmagnetic layer disposed therebetween.

2. A method of producing a giant magnetoresistive material film comprising:

forming a coercive force increasing layer of $\alpha$-Fe$_2$O$_3$ on a substrate by sputtering in an Ar gas atmosphere under a pressure of 3 mTorr or less without application of a magnetic field; and forming at least two ferromagnetic layers on the coercive force increasing layer with a nonmagnetic layer disposed therebetween.

* * * * *